US012757734B2

(12) United States Patent
Lai et al.

(10) Patent No.: US 12,757,734 B2
(45) Date of Patent: Oct. 6, 2026

(54) PACKAGE STRUCTURES AND METHODS OF MANUFACTURING THE SAME

(71) Applicant: Taiwan Semiconductor Manufacturing Company, Ltd., Hsinchu (TW)

(72) Inventors: Yu-Chia Lai, Miaoli County (TW); Chen-Hua Yu, Hsinchu City (TW); Chung-Shi Liu, Hsinchu City (TW); Hao-Yi Tsai, Hsinchu City (TW); Kuo-Chung Yee, Taoyuan City (TW); Tin-Hao Kuo, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 477 days.

(21) Appl. No.: 17/372,564

(22) Filed: Jul. 12, 2021

(65) Prior Publication Data

US 2021/0343622 A1 Nov. 4, 2021

Related U.S. Application Data

(63) Continuation of application No. 16/231,964, filed on Dec. 25, 2018, now Pat. No. 11,062,975.

(Continued)

(51) Int. Cl.

| | |
|---|---|
| ***H01L 23/40*** | (2006.01) |
| ***H01L 21/48*** | (2006.01) |
| ***H01L 21/56*** | (2006.01) |
| ***H01L 23/31*** | (2006.01) |
| ***H01L 23/538*** | (2006.01) |
| ***H10W 40/00*** | (2026.01) |
| ***H10W 40/60*** | (2026.01) |

(Continued)

(52) U.S. Cl.
CPC ........ *H10W 40/611* (2026.01); *H10W 40/037* (2026.01); *H10W 70/611* (2026.01); *H10W 70/685* (2026.01); *H10W 74/014* (2026.01); *H10W 74/117* (2026.01); *H10W 90/00* (2026.01)

(58) Field of Classification Search
CPC ............. H01L 23/4006; H01L 21/4882; H01L 21/561; H01L 23/3128; H01L 23/5383; H01L 25/0655; H10W 40/00; H10W 40/01; H10W 40/03; H10W 40/037; H10W 40/60; H10W 40/61; H10W 40/611; H10W 40/613; H10W 40/614; H10W 70/685; H10W 74/014; H10W 74/114; H10W 74/117
USPC .......................................................... 257/690
See application file for complete search history.

(56) References Cited

U.S. PATENT DOCUMENTS 4,460,917 A * 7/1984 Rogers .................... H01L 23/32 257/796
5,648,890 A * 7/1997 Loo .................... H01L 25/0655 257/726

(Continued)

FOREIGN PATENT DOCUMENTS

CN 102422412 * 4/2012
EP 1385206 B1 * 6/2015 ......... H01L 23/3121

*Primary Examiner* — David C Spalla
(74) *Attorney, Agent, or Firm* — JCIPRNET

(57) ABSTRACT

A package structure includes a first die, an encapsulant and a securing element. The encapsulant encapsulates the first die. The securing element penetrates through the encapsulant and a corner of the first die and electrically isolated from the first die.

20 Claims, 23 Drawing Sheets

Related U.S. Application Data

(60) Provisional application No. 62/737,132, filed on Sep. 27, 2018.

(51) Int. Cl.

| | |
|---|---|
| ***H10W 70/60*** | (2026.01) |
| ***H10W 70/685*** | (2026.01) |
| ***H10W 74/01*** | (2026.01) |
| ***H10W 74/10*** | (2026.01) |
| ***H10W 90/00*** | (2026.01) |

(56) References Cited

U.S. PATENT DOCUMENTS

| | | | | |
|---|---|---|---|---|
| 5,657,537 | A * | 8/1997 | Saia | H01L 23/5389 257/E21.705 |
| 5,810,607 | A * | 9/1998 | Shih | H01R 13/2414 439/91 |
| 5,926,371 | A * | 7/1999 | Dolbear | H05K 1/0204 257/713 |
| 8,269,343 | B2 * | 9/2012 | Meguro | H01L 24/81 257/725 |
| 8,455,987 | B1 * | 6/2013 | Spann | H01L 24/97 257/E23.141 |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,472,644 | B2 * | 10/2016 | Sung | H01L 21/76224 |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 11,062,975 | B2 * | 7/2021 | Lai | H01L 23/16 |
| 11,211,304 | B2 * | 12/2021 | Otremba | H01L 23/4006 |
| 2009/0096076 | A1 * | 4/2009 | Jung | H01L 25/105 257/E23.18 |
| 2009/0129036 | A1 * | 5/2009 | Fujii | H10W 70/68 257/E23.169 |
| 2009/0302435 | A1 * | 12/2009 | Pagaila | H01L 25/105 257/659 |
| 2010/0284155 | A1 * | 11/2010 | Stolze | H01L 23/4006 361/728 |
| 2014/0239488 | A1 * | 8/2014 | Kobayashi | H01L 23/367 257/718 |
| 2014/0361438 | A1 * | 12/2014 | Zeng | H01L 23/585 438/666 |
| 2016/0035658 | A1 * | 2/2016 | Kessler | H01L 23/49844 29/841 |
| 2016/0260684 | A1 * | 9/2016 | Zhai | H01L 25/0652 |
| 2019/0096841 | A1 * | 3/2019 | Liu | H01L 23/5383 |
| 2019/0101583 | A1 * | 4/2019 | Kim | G01R 31/2889 |
| 2019/0148254 | A1 * | 5/2019 | Na | H01L 24/26 257/774 |

* cited by examiner

PACKAGE STRUCTURES AND METHODS OF MANUFACTURING THE SAME

CROSS-REFERENCE TO RELATED APPLICATION

This is a continuation application of and claims the priority benefit of U.S. application Ser. No. 16/231,964, filed on Dec. 25, 2018, now patented as U.S. Pat. No. 11,062,975, which claims the priority benefit of U.S. provisional application Ser. No. 62/737,132, filed on Sep. 27, 2018. The entirety of each of the above-mentioned patent applications is hereby incorporated by reference herein and made a part of this specification.

BACKGROUND

In recent years, the semiconductor industry has experienced rapid growth due to continuous improvement in integration density of various electronic components, e.g. transistors, diodes, resistors, capacitors, etc. For the most part, this improvement in integration density has come from successive reductions in minimum feature size, which allows more components to be integrated into a given area. These smaller electronic components also require smaller packages that occupy less area than previous packages.

Currently, integrated fan-out packages are becoming increasingly popular for their compactness. In addition, the integrated fan-out packages may be further assembled with other components such as a heat spreader, a heat sink and so on. However, during assembly, there is a risk of delamination of the integrated fan-out packages and other components, which reduces the yield of the package structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
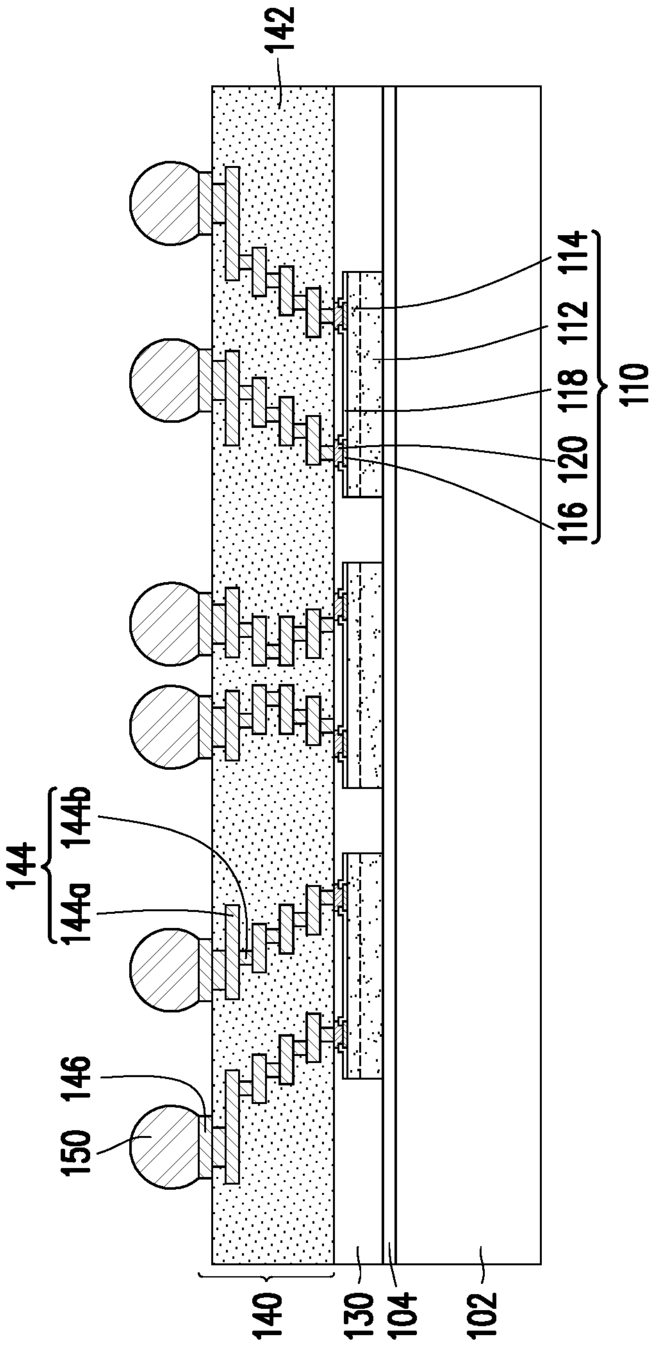
FIGS. 1A-1F are schematic cross-sectional views illustrating a method of forming a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are schematic cross-sectional views illustrating a method of forming a package structure in accordance with some embodiments of the disclosure. FIGS. 2A-2C are top views illustrating a method of forming a package structure in accordance with some embodiments of the disclosure. For clarity, in FIGS. 2A-2C, only a carrier, dies, connectors, holes, and screws are shown, and other elements are omitted.

Figure 2A:
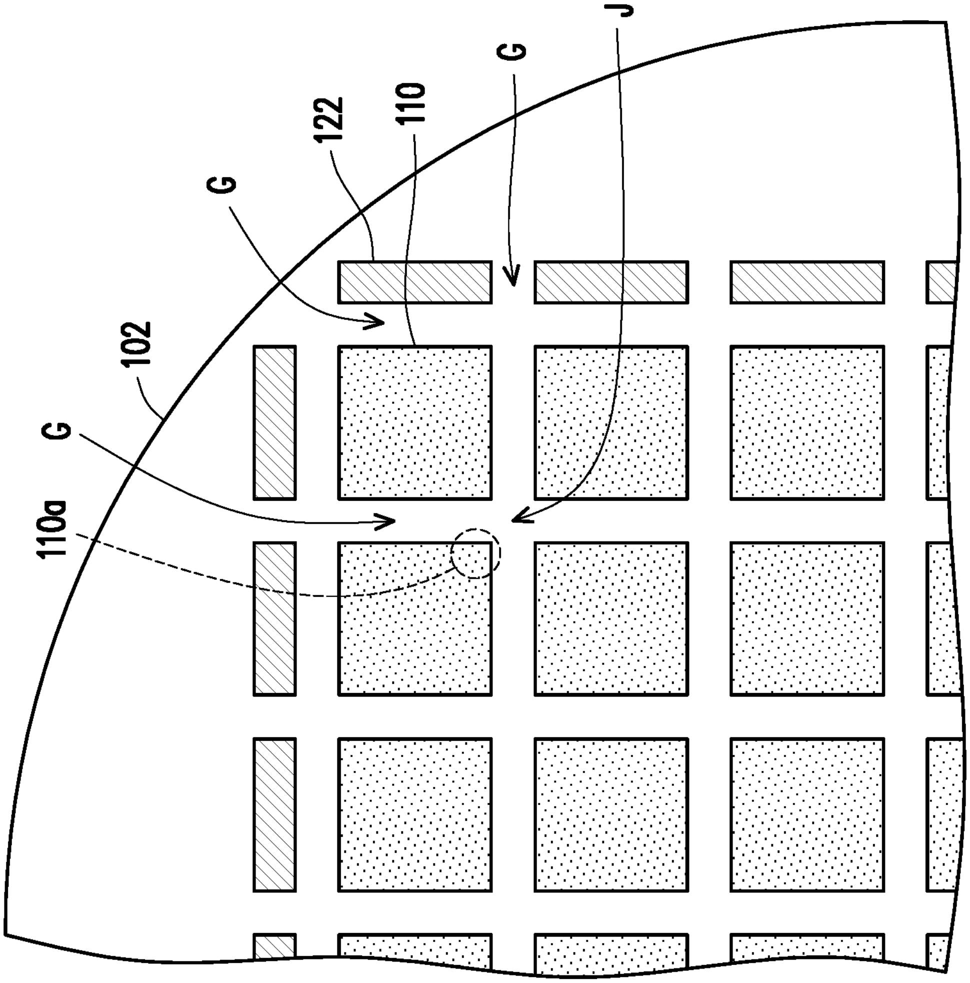
FIGS. 2A-2C are top views illustrating a method of forming a package structure in accordance with some embodiments of the disclosure.
Figure 2B:
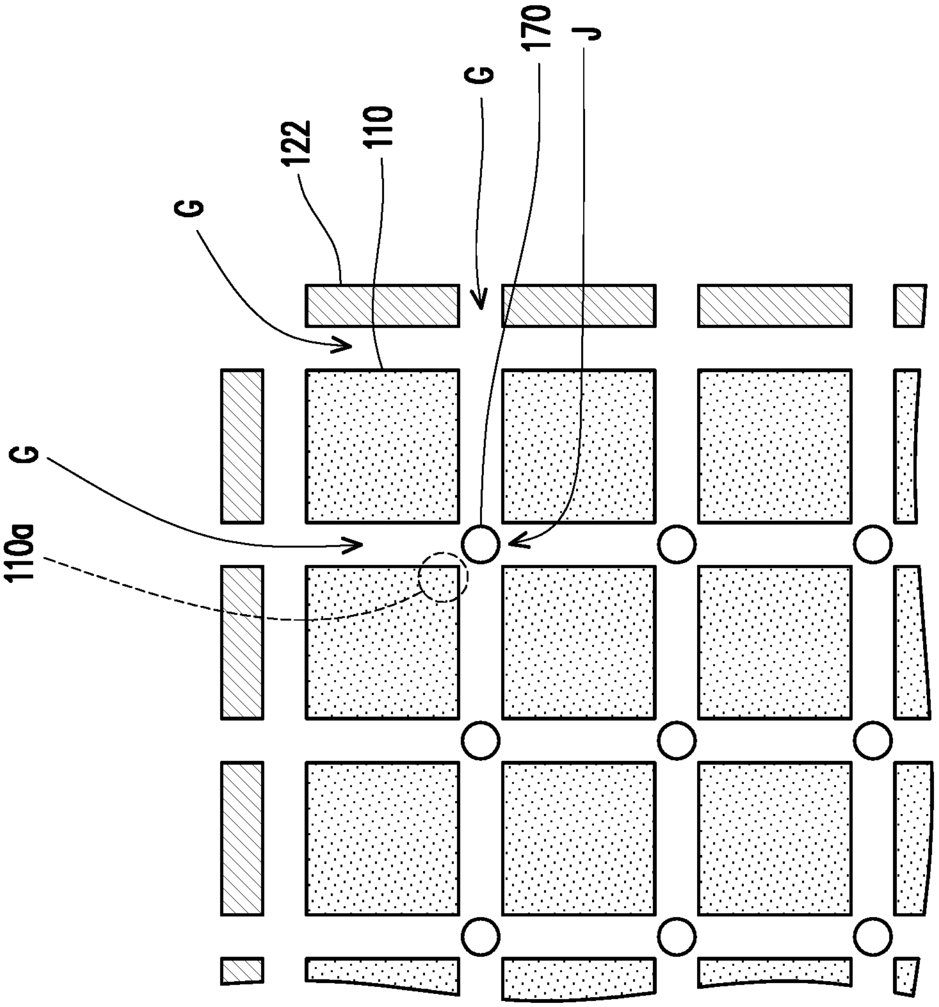
Figure 2C:
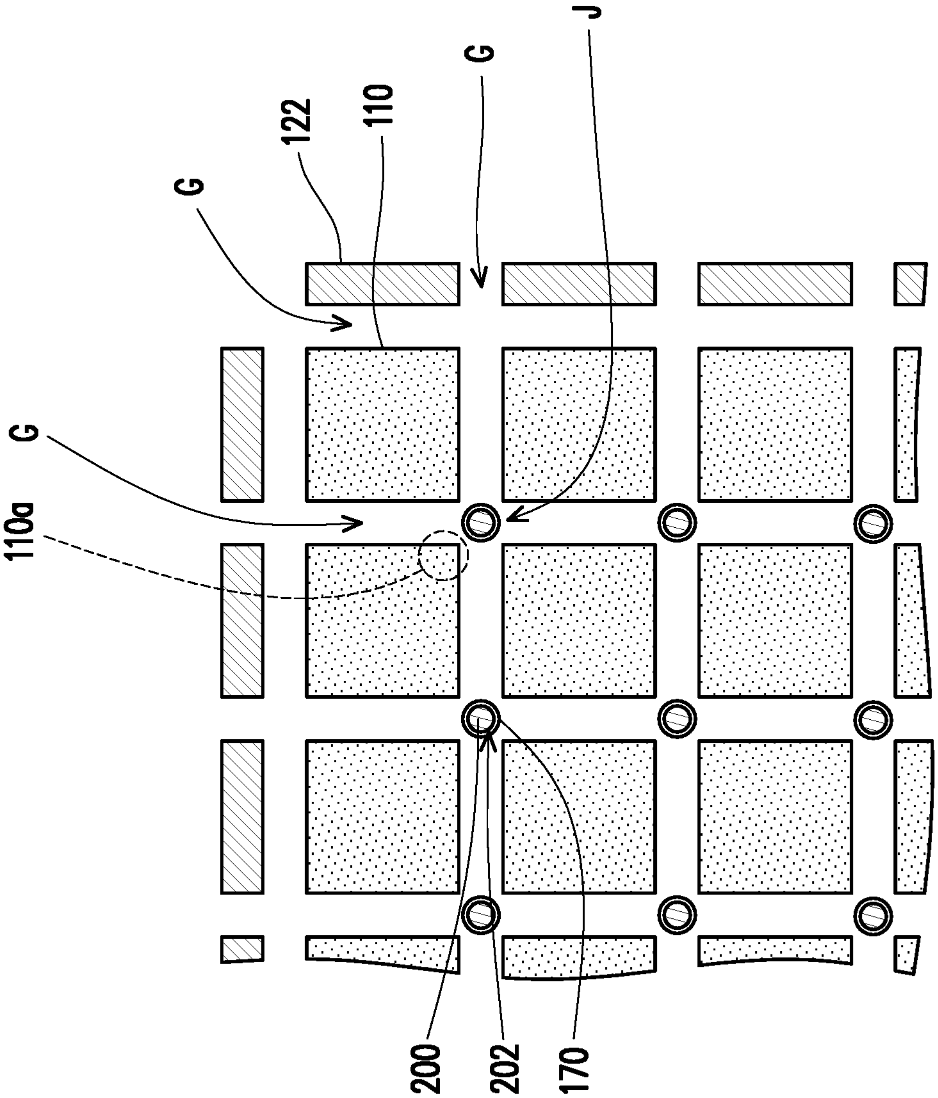

Referring to FIGS. 1A and 2A, a plurality of dies 110 are provided over a carrier 102. In some embodiments, an adhesive layer 104 is formed over the carrier 102, and the dies 110 are placed onto the carrier 102 by the adhesive layer 104. In some embodiments, the carrier 102 is, for example, a glass substrate. A shape of the carrier 102 may be circle, rectangle or other suitable shape. In some embodiments, the adhesive layer 104 is a die attach film (DAF). However, the materials of the carrier 102 and the adhesive layer 104 are merely for illustration, and the disclosure is not limited thereto. In some embodiments, connectors 122 are formed aside the dies 110 and electrically connected to the dies 110. In some embodiments, the connectors 122 are disposed at the periphery of the carrier 102 to surround the dies 110, for example.

The dies 110 are adjacent to and separated from each other. In some embodiments, the dies 110 are arranged in an array including a plurality of rows and columns, the row is paralleled to a first direction, and the column is paralleled to a second direction perpendicular to the first direction, for example. In some embodiments, the sidewalls of the dies 110 in the same row are extended in the first direction and aligned with one another, and similarly, the sidewalls of the dies 110 in the same column are extended in the second direction and aligned with one another. In some embodiments, a gap G is formed between sidewalls of two of the adjacent dies 110 and/or connectors 122. In some embodiments, the gap G is formed between the sidewalls of two adjacent dies 110, two adjacent die 110 and connector 122 or two adjacent connectors 122. In some embodiments, a width of the gap G may be defined as the shortest distance between sides of the dies 110 and/or connectors 122, and the width of the gap G ranges from 3 mm to 5 mm, for example. In some embodiments, the width of the gap G between the sidewalls of two adjacent dies 110, two adjacent die 110 and connector 122 or two adjacent connectors 122 is the same or different. A junction J is formed among corners of three or more of the adjacent dies 110 and connectors 122. In some embodiments, the junction J is formed among four of the adjacent dies 110, for example. In some embodiments, a diameter of the junction J may be defined as a distance between the corners 110*a* of the two adjacent dies 110 on a diagonal line (such as a distance between the corner 110*a* of the die 110 on the upper left side and the corner 110*a* of the die 110 on the lower right side), and the diameter of the junction J ranges from 3 mm to 5 mm, for example. In some embodiments, the dies 110 may have the same or different shape, and the dies 110 may have the same or different size, for example.

In some embodiments, the dies 110 may be the same types of chips or different types of chips and may be digital chips, analog chips or mixed signal chips, such as application-specific integrated circuit ("ASIC") chips, high bandwidth memory (HBM) chips, sensor chips, wireless and radio frequency chips, memory chips, logic chips or voltage regulator chips. In some embodiments, the die 110 includes a substrate 112, a device layer 114, a plurality of pads 116, a passivation layer 118 and a plurality of vias 120 over the substrate 112. The substrate 112 may be an elementary semiconductor such as silicon or germanium and/or a compound semiconductor such as silicon germanium, silicon carbide, gallium arsenic, indium arsenide, gallium nitride or indium phosphide. The device layer 114 may be an integrated circuit device formed in and/or on the substrate 112, and may be a transistor, and includes a gate structure, source/drain regions, and isolation structures, for example. The pads 116 are disposed on an active surface of the die 110 and electrically connected to the device layer 114 and partially exposed by the passivation layer 118. The pad 116 may be an aluminum pad or an aluminum-copper pad, although other metallic materials may be used. In some embodiments, the pad 116 may be in physical contact with topmost conductive layers (or pads) of the device layer 114 with or without vias therebetween. The passivation layer 118 may be formed using a non-low-k dielectric material. The passivation layer 118 may be formed of un-doped silicate Glass (USG), silicon nitride, tetraethoxysilane (TEOS), or the like. In some embodiments, the passivation layer 118 may be a multiple-layered or single-layered structure. The vias 120 are disposed on and electrically connected to the pads 116. The vias 120 may have different or the same height. In some alternative embodiments, the via 120 may include a seed layers and a metal layer, and the seed layer is disposed on a bottom and/or a sidewall of the metal layer. Materials of the vias 120 may include, for example, copper, copper alloys, or other suitable choice of materials.

After that, an encapsulant 130 is formed to encapsulate the dies 110. In some embodiments, the encapsulant 130 is formed aside the dies 110 and filled the gaps between the dies 110 over the carrier 102, and top surfaces of the dies 110 are exposed. In some embodiments, the encapsulant 130 is further formed between the connectors 122 and encapsulates the connectors 122. In some embodiments, the encapsulant 130 surrounds and is in contact with sidewalls of the vias 120, and a top surface of the encapsulant 130 is flush with top surfaces of the vias 120 of the dies 110. In some embodiments, the encapsulant 130 may include a material such as epoxy resin, heat-resistant crystalline resin, polybenzoxazole, polyimide, phenylcyclobutene, polyphenylene sulfide, polyether ether ketone, polyether, a combination thereof, or the like. In some embodiments, the encapsulant 130 may further include fillers dispersed in the material, for example. A method of forming the encapsulant 130 may include a molding process, a deposition process, a coating process or the like, and further include a planarization process such as a mechanical grinding, a chemical mechanical polishing (CMP) or the like. In detail, a material of the encapsulant 130 is formed to fill the gaps between the dies 110 and covers the top surfaces of the dies 110. Then, the planarization process is performed on the material of the encapsulant 130 until the top surfaces of the dies 110 are exposed. After the material of encapsulant 130 is partially removed, the encapsulant 130 is formed, and the top surface of the encapsulant 130 is coplanar with the top surfaces of the vias 120 of the dies 110. In some alternative embodiments, during the aforementioned planarization process, portions of the vias 120 may be also grinded. In some alternative embodiments, the die 110 may further include a protection layer over the passivation layer 118 and the vias 120, and the protection layer may have a top surface flush with the top surfaces of the vias 120 and the encapsulant 130 after the planarization process. A material of the protection layer may be organic materials such as polybenzoxazole (PBO), polyimide (PI) layer or the like or inorganic materials.

Then, a redistribution structure 140 is formed over the encapsulant 130 and front sides of the dies 110. The redistribution structure 140 is formed over the top surfaces of the encapsulant 130 and the vias 120 of the dies 110. In some embodiments, the redistribution structure 140 includes a dielectric layer 142 and a plurality of redistribution conductive patterns 144, 146 in the dielectric layer 142. In some embodiments, the dielectric layer 142 is a multiple-layered or single-layered structure. In some embodiments, the redistribution conductive patterns 144 include a plurality of conductive layers 144*a* and a plurality of conductive vias 144*b* between the conductive layers 144*a* and each having a width smaller than a width of the conductive layer 144*b*, for example. The redistribution conductive patterns 144 are electrically connected to the vias 120. In some embodiments, the top surfaces of the vias 120 are in contact with the bottommost redistribution conductive patterns 144 of the redistribution structure 140. In some alternative embodiments, the redistribution conductive pattern 144 may include a seed layer and a conductive layer, and the seed layer is disposed on a bottom and/or a sidewall of the conductive layer. The top surfaces of the vias 120 are partially covered by the dielectric layer 142. In some embodiments, the topmost redistribution conductive patterns 146 include a plurality of pads. In some embodiments, the aforementioned pads include a plurality of under-ball metallurgy (UBM) patterns for ball mount and/or at least one connection pad for mounting of passive components. The number of the under-ball metallurgy patterns and the connection pad is not limited in this disclosure.

Then, the conductive elements 150 are disposed on and electrically connected to the redistribution structure 140. In some embodiments, the conductive elements 150 are, for example, solder balls or ball grid array ("BGA") balls placed on the redistribution structure 140 and the topmost redistribution conductive patterns 146 underlying the conductive elements 150 functions as ball pads. In some embodiments, the conductive elements 150 are electrically connected to the dies 110 through the redistribution structure 140.

Figure 1B:
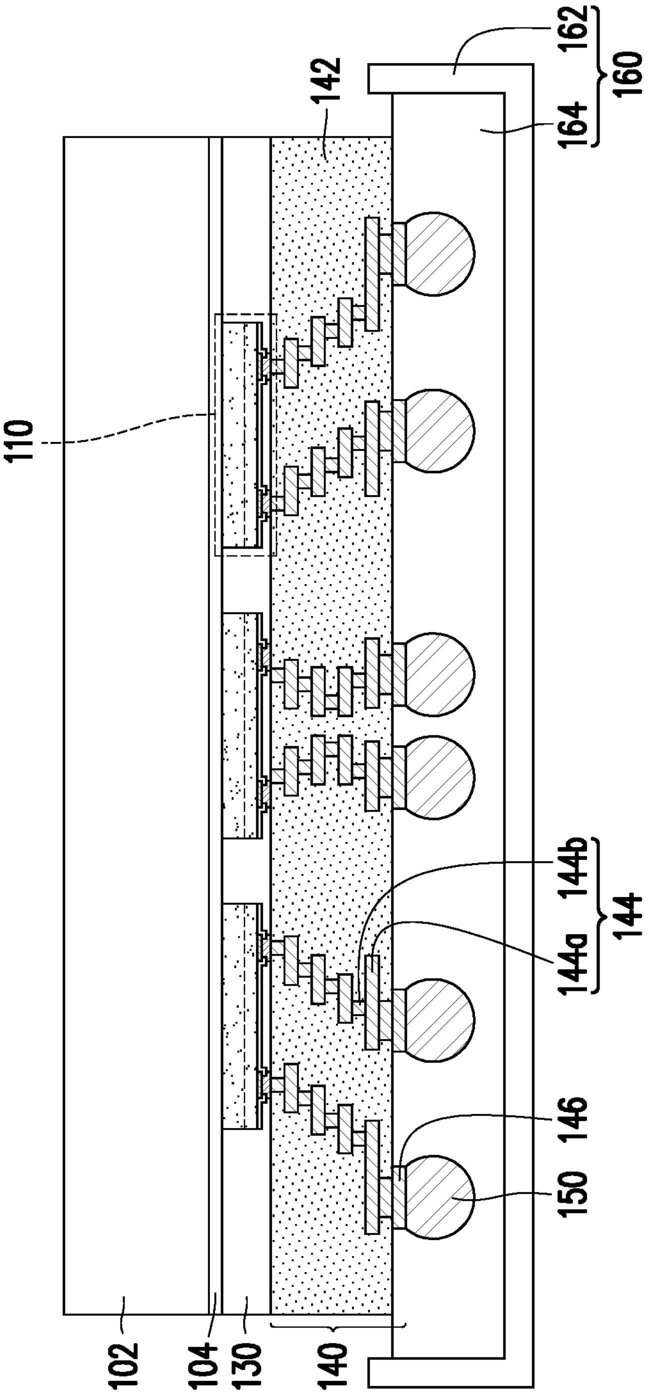

Referring to FIG. 1B, in some embodiments, the structure of FIG. 1A is turned upside down and mounted on a frame 160. In some embodiments, the conductive elements 150 are in contact with the frame 160. In some embodiments, the frame 160 includes a frame body 162 and a tape 164 thereon, and the conductive elements 150 may be inserted into the tape 164, in other words, the tape 164 may surround the conductive elements 150.

Figure 1C:
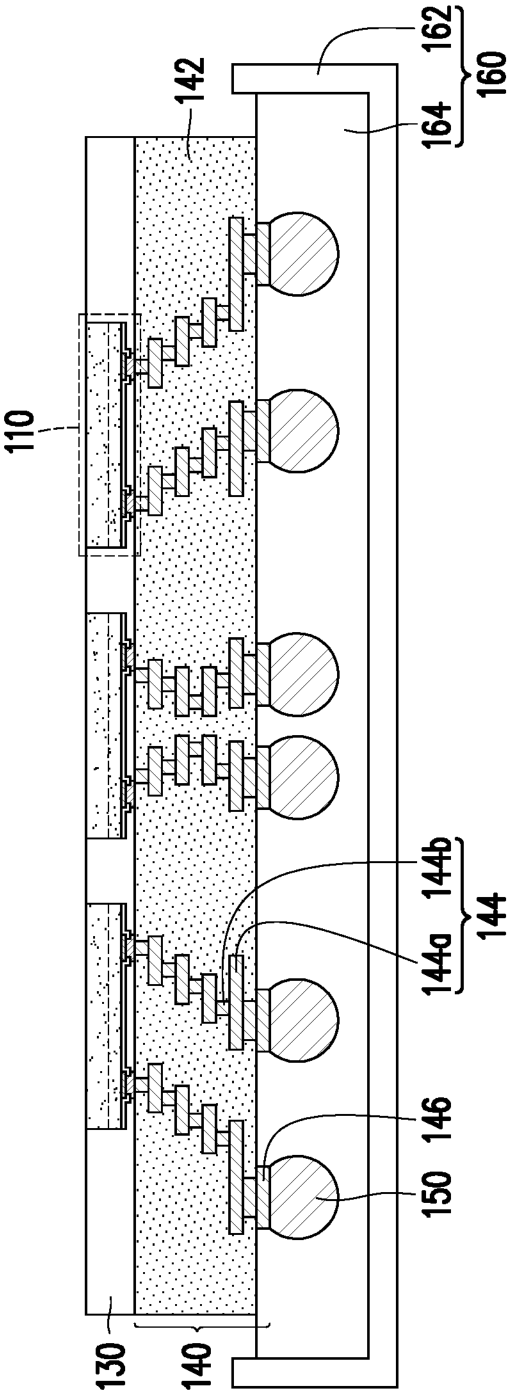

Then, as shown in FIG. 1C, the whole package is debonded from the carrier 102 by removing the adhesive layer 104. In some embodiments, the adhesive layer 104 may be removed by application of heat and/or laser energy. In some embodiments, after debonded from the carrier 102, the backsides of the dies 110 opposite to the front sides are exposed, for example. In some alternative embodiments, a dielectric layer may be formed between the adhesive layer 104 and the carrier 102, and after the removal of the adhesive layer 104, the dielectric layer may be retained at the backsides of the dies 110 and exposed.

Figure 1D:
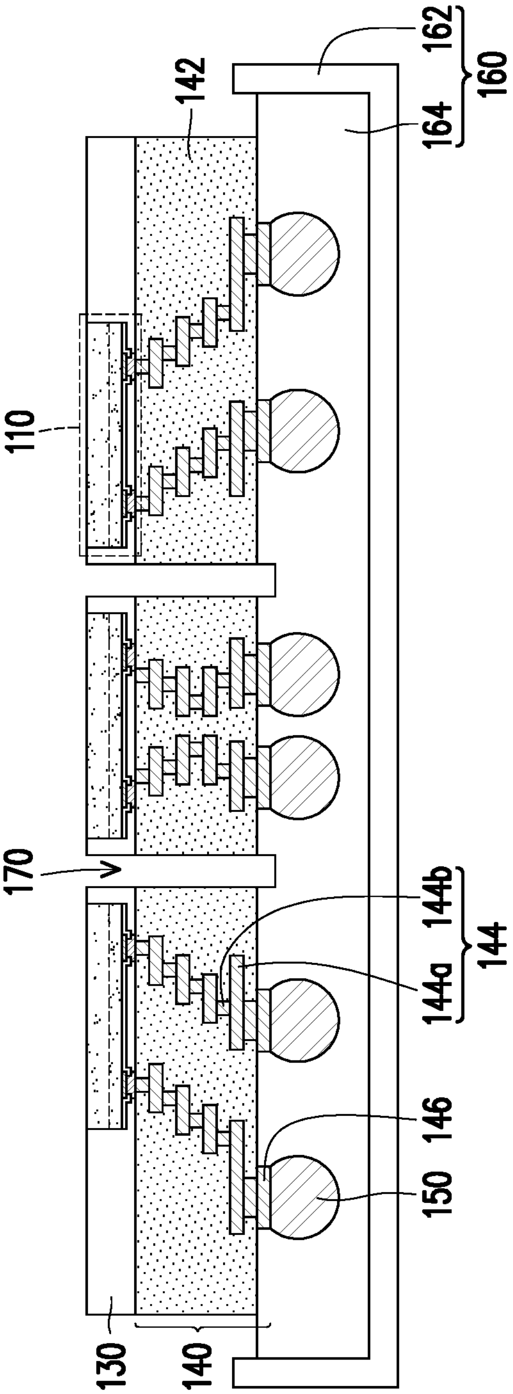
Figure 3:
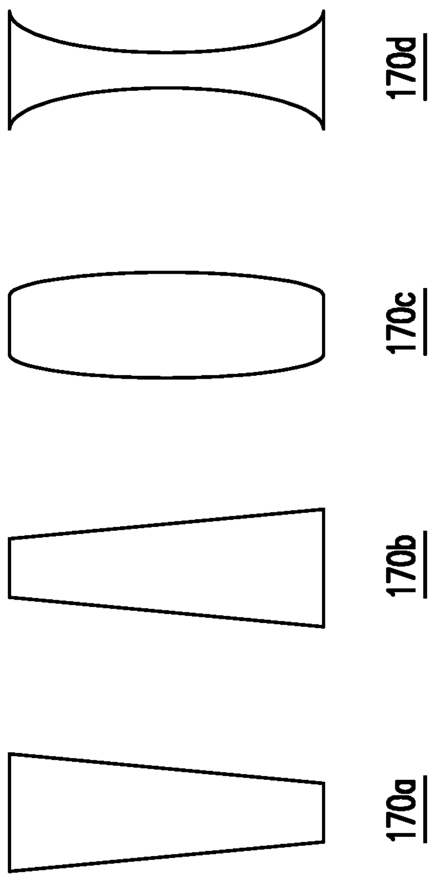
FIG. 3 is a schematic cross-sectional view illustrating a hole for a screw of a package structure in accordance with some embodiments of the disclosure.

Referring to FIGS. 1D and 2B, a plurality of holes 170 are formed. In some embodiments, the holes 170 are formed at the junctions J of the adjacent dies 110, for example. However, the disclosure is not limited thereto. In some alternative embodiments, the holes 170 may be formed at the gaps G, for example. In some embodiments, the holes 170 are formed in the encapsulant 130 and the dielectric layer 142 of the redistribution structure 140, and may be formed by removing portions of the encapsulant 130 and the dielectric layer 142 of the redistribution structure 140. In some embodiments, after partially removed, a sidewall of the encapsulant 130 is flush with a sidewall of the dielectric layer 142 of the redistribution structure 140. In some embodiments, the encapsulant 130 and the dielectric layer 142 may be partially removed by a laser drill process, an etching process or the like, for example. In addition, in some embodiments, portions of the tape 164 are also removed during the formation of the holes 170, so as to assure the holes 170 penetrating the dielectric layer 142. In other words, the holes 170 may further penetrate portions of the tape 164. In some embodiments, edges of the dies 110 are separated from the holes 170 by a distance, and thus the dies 110 not in contact with the holes 170, for example. In some embodiments, the corners 110*a* of the dies 110 are separated from the holes 170. In some embodiments, the hole 170 has a constant diameter, in other words, the hole 170 has a substantially straight sidewall. In some embodiments, a cross-sectional profile of the hole 170 may be a rectangle, for example. However, the disclosure is not limited thereto. In some alternative embodiments, as shown in FIG. 3, a cross-sectional profile of the hole 170*a*-170*d* may be respectively a trapezoid, an inverted-trapezoid, a barrel profile, a narrow-middle profile or the like, for example. In some embodiments, the narrow-middle profile has a narrow middle, a wide top and a wide bottom. Specifically, the narrow-middle profile may be a vase-shaped profile, an hourglass-shaped profile or the like. In some embodiments, a diameter of the holes 170 ranges from 3 μm to 5 μm, for example.

Figure 1E:
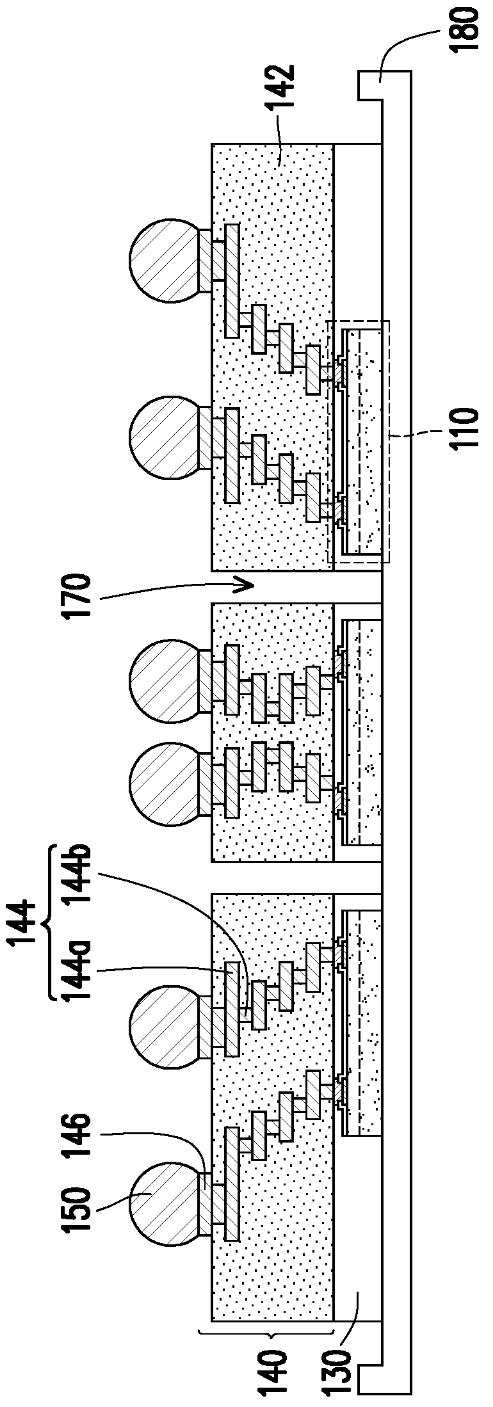
Figure 1F:
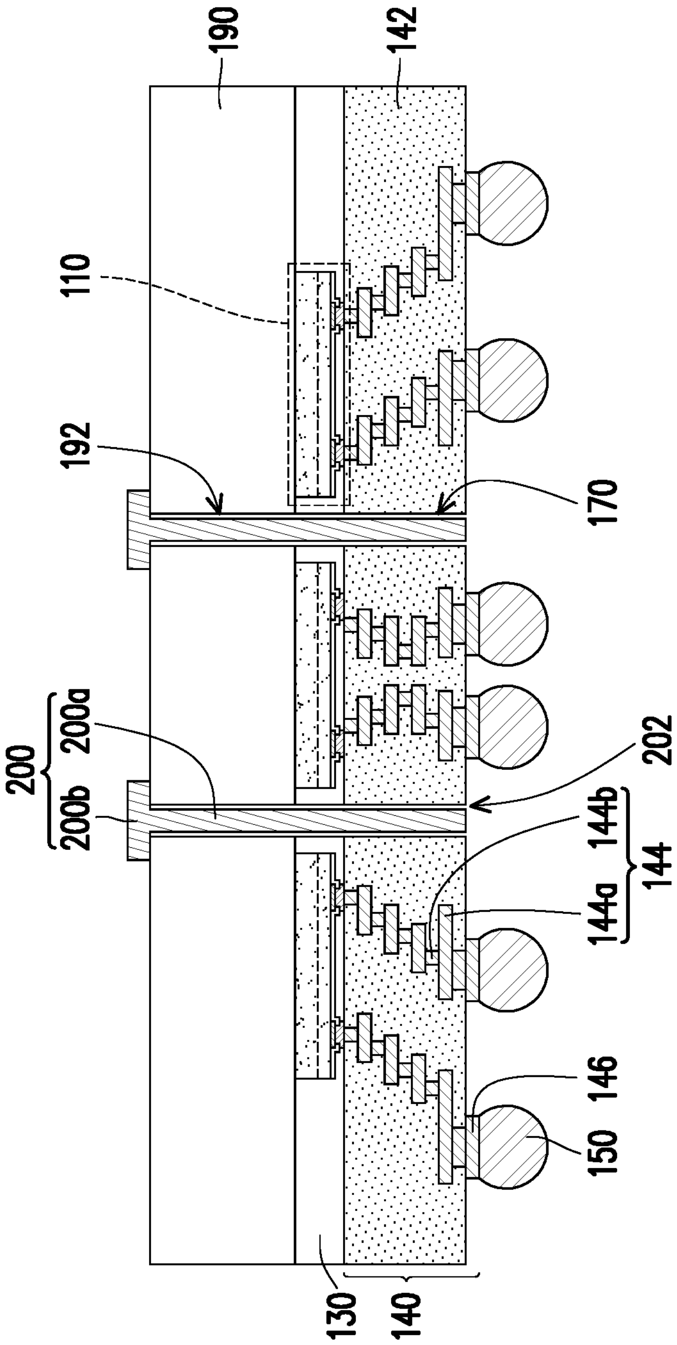

Referring to FIG. 1E, after forming the holes 170, the whole package of FIG. 1D is turned upside down and re-mounted onto a frame 180. Referring to FIGS. 1F and 2C, a device 190 having a plurality of holes 192 is provided, and then the device 190 is assembled to the whole package of FIG. 1E by inserting a plurality of screws 200 into the holes 170, 192. In some embodiments, the device 190 and the redistribution structure 140 are disposed at opposite sides (i.e., the backsides and the front sides) of the dies 110. In some embodiments, the holes 192 of the device 190 are formed corresponding to the holes 170 of the package 100. In some embodiments, a size of the hole 192 of the device 190 may be substantially the same as a size of the corresponding hole 170 of the package 100. In some alternative embodiments, the size of the hole 192 of the device 190 may be different from a size of the corresponding hole 170 of the package 100. In some embodiments, the holes 192 have the same size, for example. In some alternative embodiments, the holes 192 may have different size, for example. In some embodiments, the size of the hole 192 of the device 190 ranges from 3 mm to 5 mm, for example.

In some embodiments, first, the package is turned upside down, and the device 190 is placed onto the package by aligning the holes 192 of the device 190 and the holes 170 of the package 100. Then, the screws 200 are inserted into the holes 170, 192 respectively, so as to assemble the device 190 and the package 100. In some embodiments, the screw 200 is disposed in the encapsulant 130 among the dies 110, and the screw 200 are adjacent to the corners 110*a* of the dies 110. In addition, the screw 200 is disposed in the dielectric layer 142 aside the redistribution conductive patterns 144 of the redistribution structure 140. In some embodiments, the screw 200 is disposed between the adjacent redistribution conductive patterns 144. In some embodiments, the screw 200 is electrically insulated from the dies 110 and the redistribution structure 140 by the encapsulant 130 and the dielectric layer 142. In some embodiments, the screws 200 may be arranged regularly or randomly.

In some embodiments, a gap 202 surrounds the screw 200 and is formed between the screw 200 and sidewalls of the holes 170, 192. In other word, the screw 200 may be not filled in the holes 170, 192. The gap 202 is disposed between the screw 200 and peripheries of the dies 110. Accordingly, the screw 200 is not in contact with the sidewalls of the holes 170, 192. In some embodiments, the screw 200 is separated from and thus not in contact with sidewalls of the dielectric layer 142 of the redistribution structure 140, the encapsulant 130 and the device 190. In some embodiments, the gap 202 and ranges from 0.15 mm to 0.3 mm, for example. However, the disclosure is not limited thereto. In some alternative embodiments, the screws 200 may be filled in the holes 170, 192, in other words, the screws 200 may be in contact with the sidewalls of the holes 170, 192 which are formed from the sidewalls of the dielectric layer 142 of the redistribution structure 140, the encapsulant 130 and the device 190.

In some embodiments, the screw 200 may have a main portion 200*a* and a head 200*b*. A diameter of the main portion 200*a* is smaller than or substantially equal to the diameter of the holes 170, 192, and thus the main portion 200*a* may be inserted into the holes 170, 192. A diameter of the head 200*b* is larger than the diameter of the holes 170, 192, and thus the head 200*b* is disposed against a top surface of the device 190 after the main portion 200*a* is inserted into the holes 170, 192. Accordingly, the screw 200 secures the device 190 onto the package 100. In some embodiments, a material of the screw 200 may be stainless steel or other suitable material, for example. In some embodiments, the device 190 may be a heat-dissipation device such as a heat sink, a heat spreader or the like or other suitable component or module.

Figure 4A:
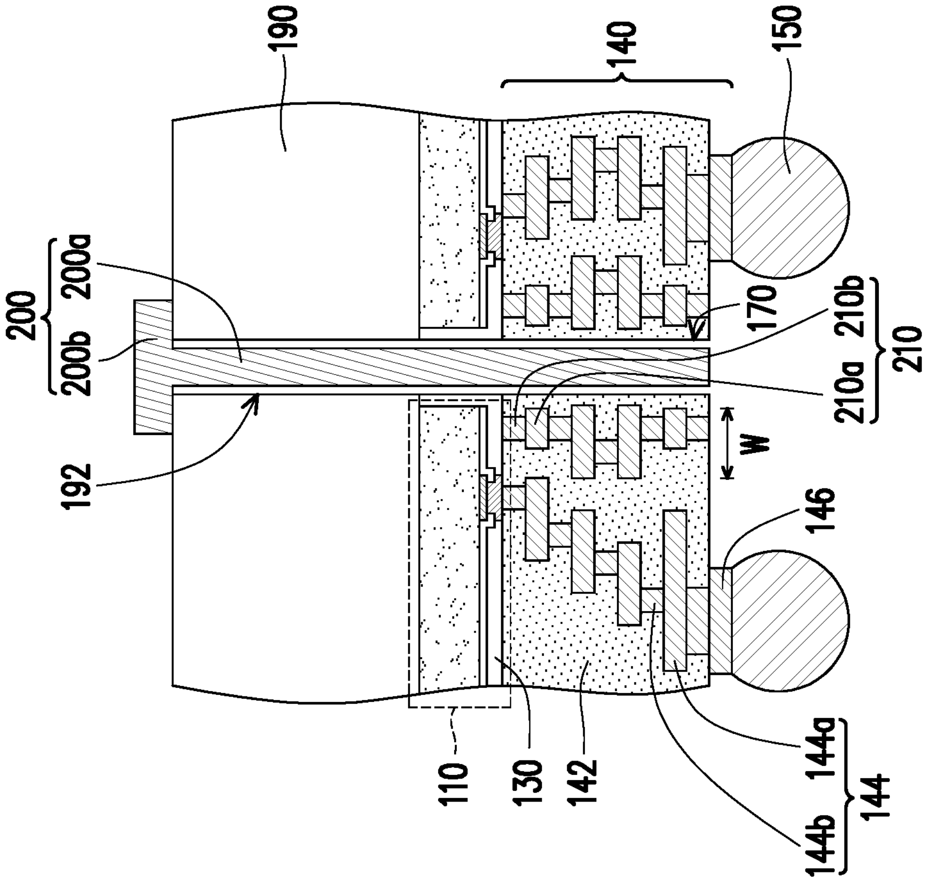
FIG. 4A is a schematic cross-sectional view illustrating a package structure in accordance with some embodiments of the disclosure.
Figure 4B:
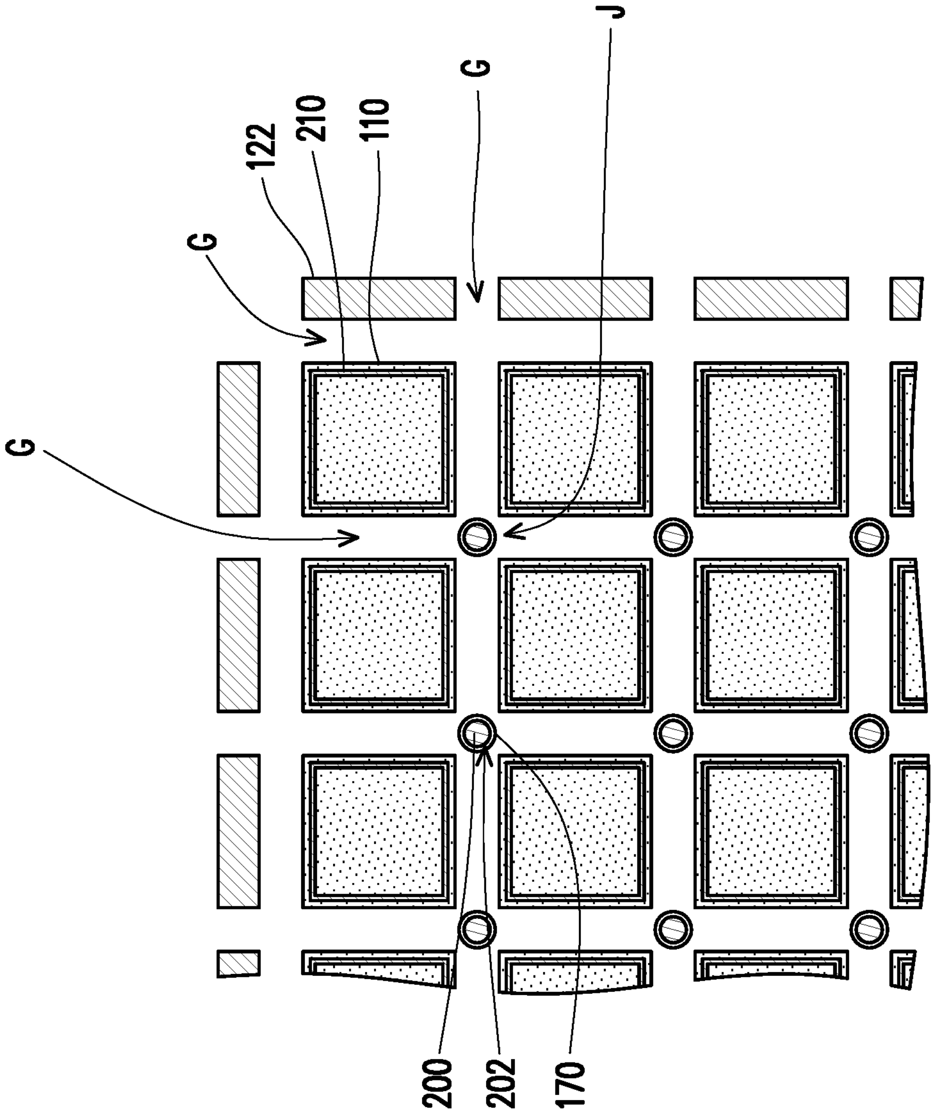
FIG. 4B is a top view of the package structure of FIG. 4A in accordance with some embodiments of the disclosure.

FIG. 4A is a schematic cross-sectional view illustrating a package structure in accordance with some embodiments of the disclosure, and FIG. 4B is a top view of the package structure of FIG. 4A in accordance with some embodiments of the disclosure. For clarity, in FIG. 4B, only dies, connectors, seal rings, holes, and screws are shown, and other elements are omitted. The package structure of FIGS. 4A and 4B is similar to the package structure of FIGS. 1F and 2C, and the main difference lies in that in the package structure of FIGS. 4A and 4B, a seal ring is disposed aside a screw. The elements similar to or substantially the same as the elements described previously will use the same reference numbers, and certain details or descriptions of the same elements may not be repeated herein. Referring to FIGS. 4A and 4B, seal rings 210 are disposed aside screws 170 respectively. In some embodiments, the seal ring 210 surrounds the screw 170, and the seal ring 210 is disposed between redistribution conductive patterns 144 of a redistribution structure 140 and the screw 170. In some embodiments, the seal ring 210 is electrically floating. In some embodiments, the seal ring 210 is disposed in a dielectric layer 142 of the redistribution structure 140, and the seal ring 210 is electrically insulated from the redistribution conductive patterns 144 and the screws 170 by the dielectric layer 142. In addition, the seal ring 210 is electrically insulated from the dies 110.

In some embodiments, the seal ring 210 may be formed with a profile similar to the redistribution conductive patterns 144 of the redistribution structure 140. In some embodiments, the seal ring 210 may be formed simultaneously with the redistribution conductive patterns 144 of the redistribution structure 140. In some embodiments, the seal ring 210 includes a plurality of conductive layers 210*a* and a plurality of conductive vias 210*b* each having a width smaller than a width of the conductive layer 210*a*. In some embodiments, the conductive layers 210*a* and the conductive vias 210*b* are stacked alternately. In some embodiments, one conductive via 210*b* is disposed between two vertically adjacent conductive layers 210. The conductive layers 210*a* may be formed simultaneously with the conductive layers 144*a* of the redistribution conductive patterns 144, and the conductive vias 210*b* may be formed simultaneously with the conductive vias 144*b* of the redistribution conductive patterns 144. In some embodiments, a material of the conductive layers 210*a* may be the same as a material of the conductive layers 144*a* of the redistribution conductive patterns 144, and a material of the conductive vias 210*b* may be the same as a material of the conductive vias 144*b* of the redistribution conductive patterns 144. However, in some alternative embodiments, the seal rings 210 may be formed separately from the redistribution conductive patterns 144 of the redistribution structure 140, and a material of the seal rings 210 may be different from the redistribution conductive patterns 144 of the redistribution structure 140, for example. In some embodiments, a width W of the seal ring 210 at one side of the hole 170 ranges from 40 nm to 60 nm, for example. The material of the seal rings 210 may be conductive material such as copper, aluminum or alloys thereof. However, the disclosure is not limited thereto. In some alternative embodiments, the material of the seal rings 210 may be non-conductive materials. A method of forming the seal rings 210 includes a plating process, a deposition process, or the like. It should be appreciated by those skilled in the art that the number and the size of the conductive layers 210*a* and the conductive vias 210*b* is merely an example, and the number and the size of the conductive layers 210*a* and the conductive vias 210*b* is not limited by the embodiments of the disclosure.

Figure 5A:
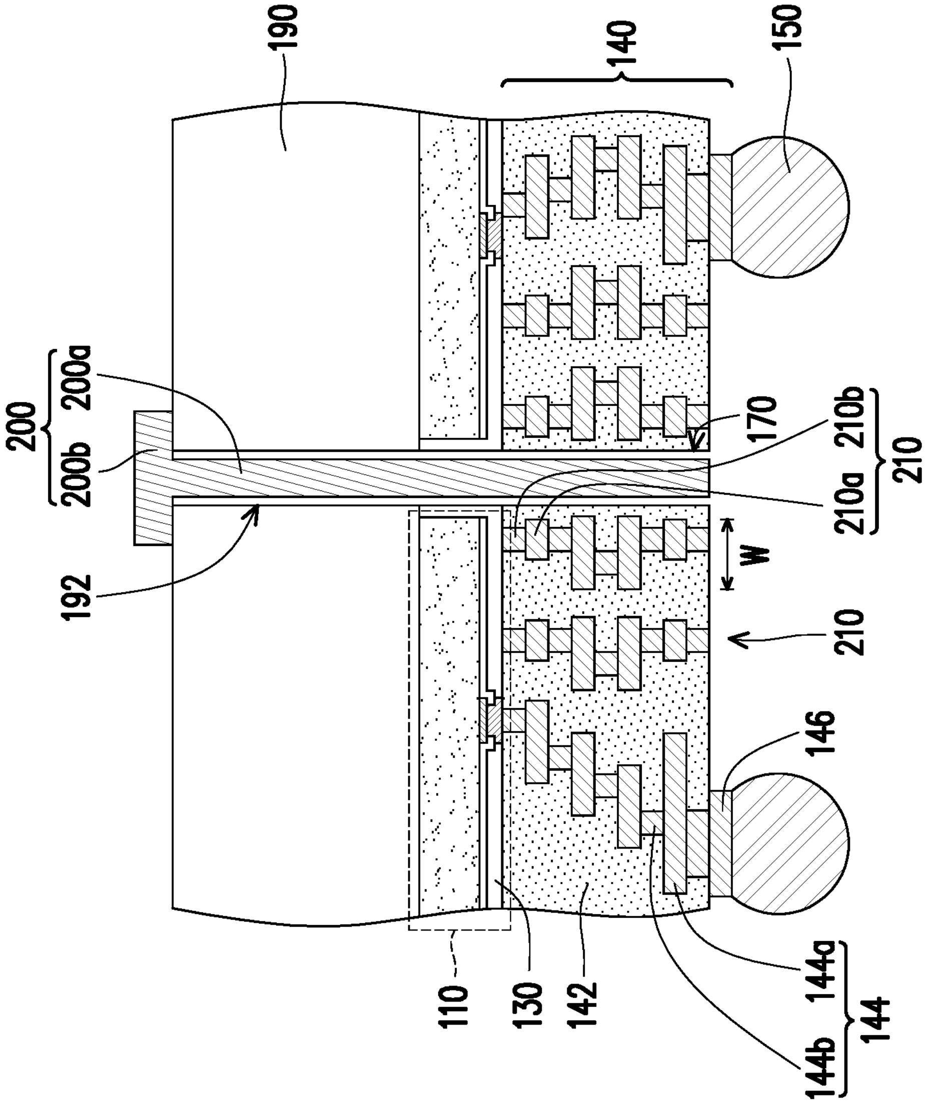
FIG. 5A is a schematic cross-sectional view illustrating a package structure in accordance with some embodiments of the disclosure.
Figure 5B:
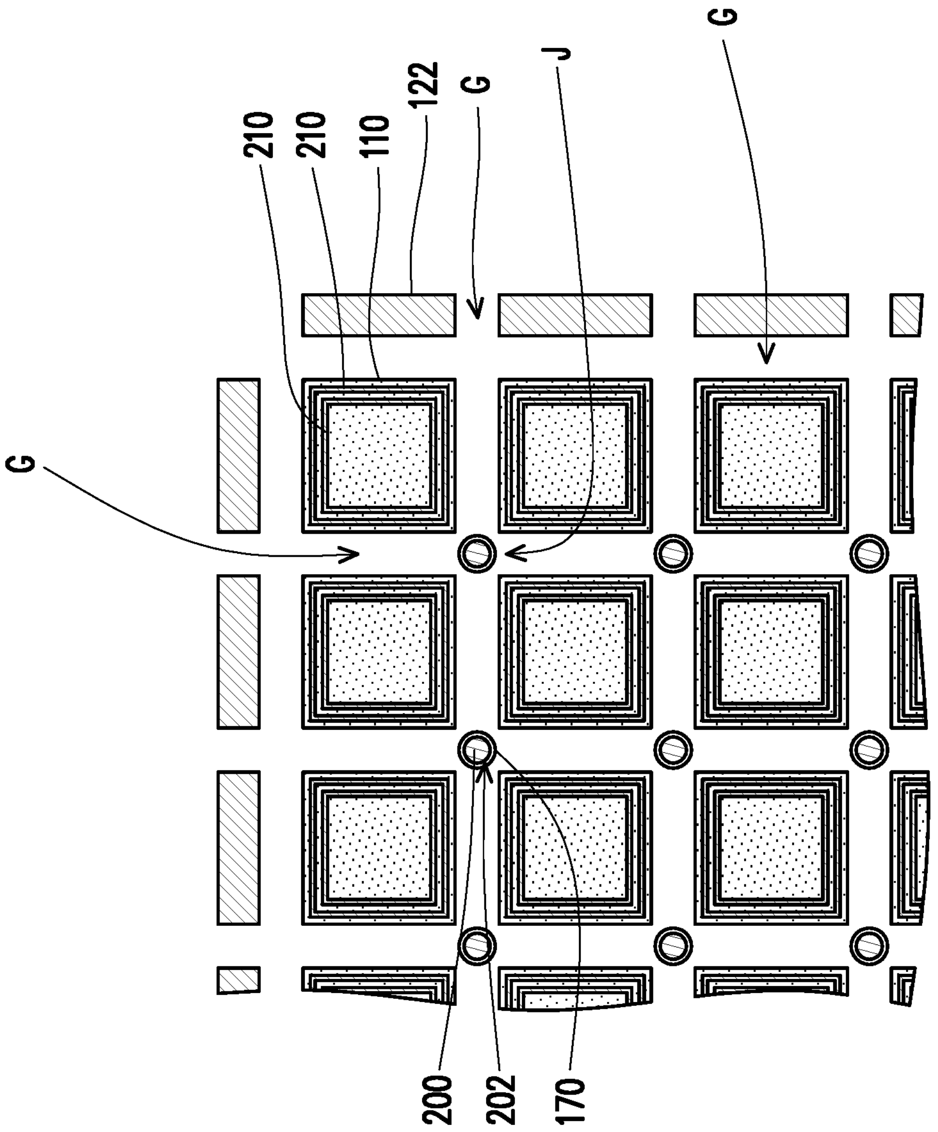
FIG. 5B is a top view of the package structure of FIG. 4A in accordance with some embodiments of the disclosure.

In some embodiments, the screw 170 is surrounded by one seal ring 210, for example. However, the disclosure is not limited thereto. In some alternative embodiments, as shown in FIGS. 5A and 5B, one screw 170 may be surrounded by a plurality of seal rings 210. In other words, one screw 170 may be surrounded by two or more seal rings 210. The seal rings 210 are disposed between the screw 170 and the redistribution conductive patterns 144 of the redistribution structure 140. In some embodiments, the seal rings 210 may have the same or different profile. In some embodiments, the seal rings 210 are separated and electrically insulated from each other. In some embodiments, a width W of the seal ring 210 at one side of the hole 170 ranges from 40 nm to 60 nm, for example. It should be appreciated by those skilled in the art that the number and the size of the seal rings 210 is merely an example, and the number and the size of the seal rings 210 is not limited by the embodiments of the disclosure.

Figure 6:
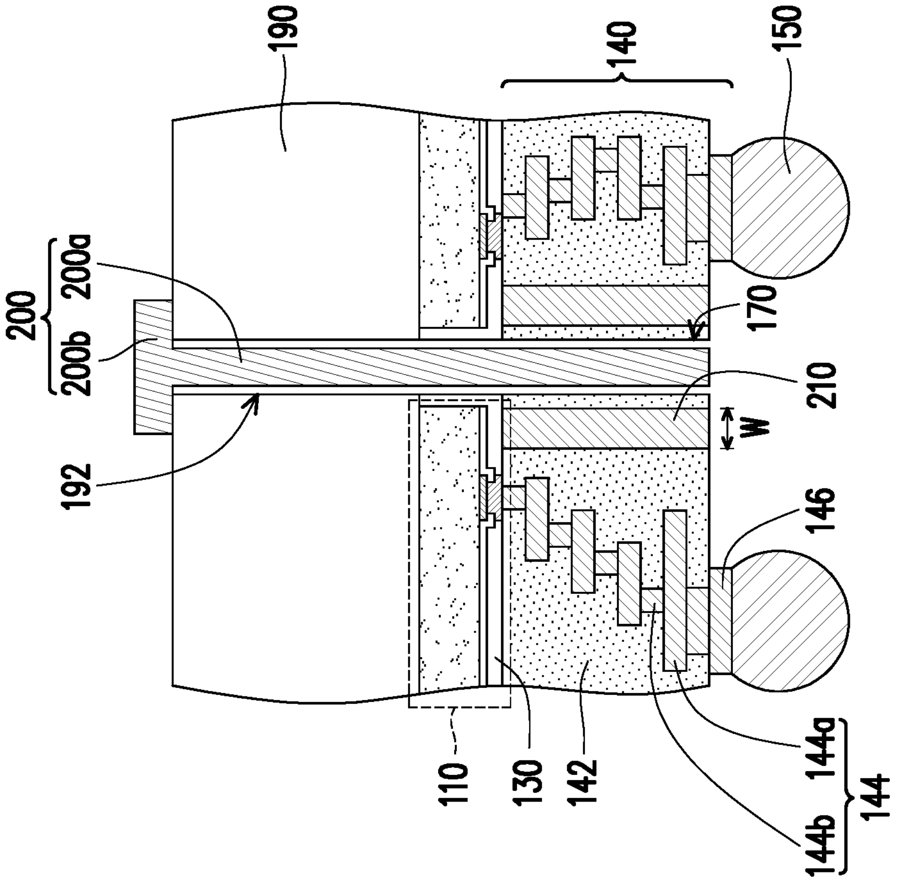
FIG. 6 is a schematic cross-sectional view illustrating a package structure in accordance with some embodiments of the disclosure.
Figure 7A:
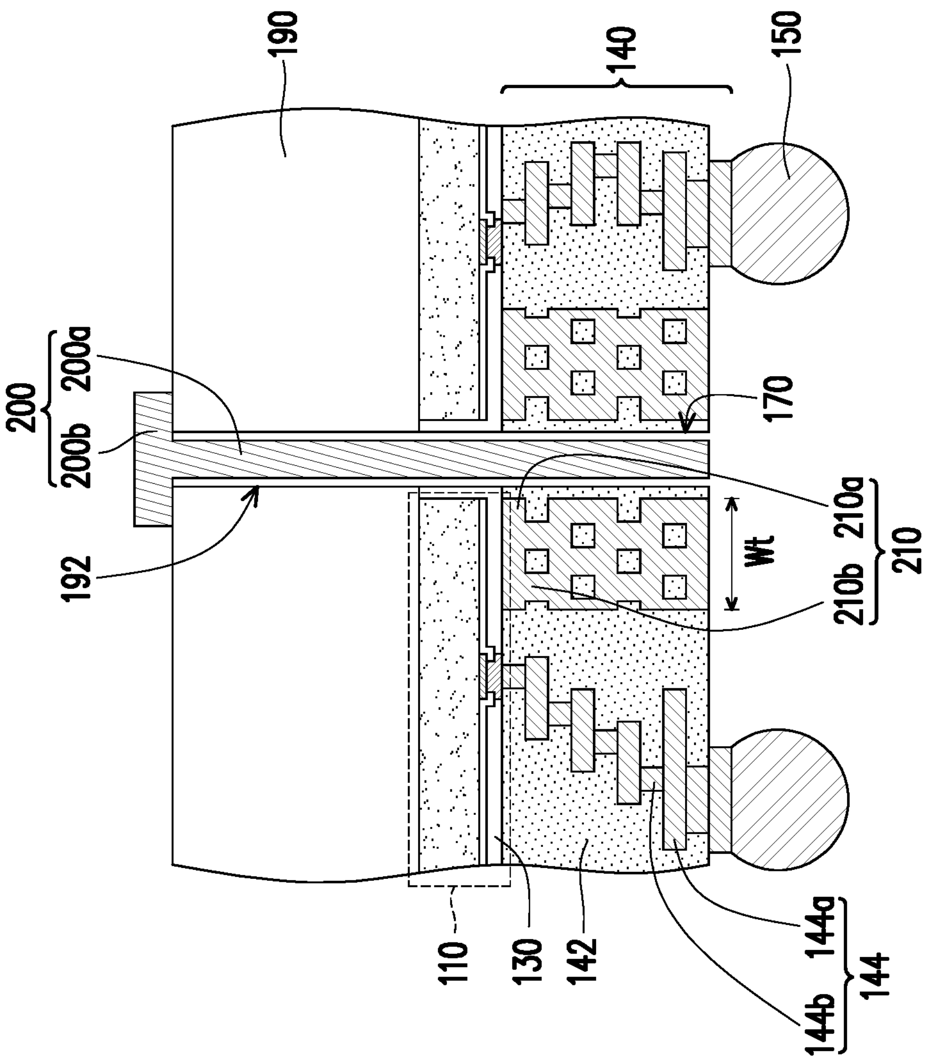
FIGS. 7A and 7B are schematic cross-sectional views illustrating a package structure in accordance with some embodiments of the disclosure.
Figure 7B:
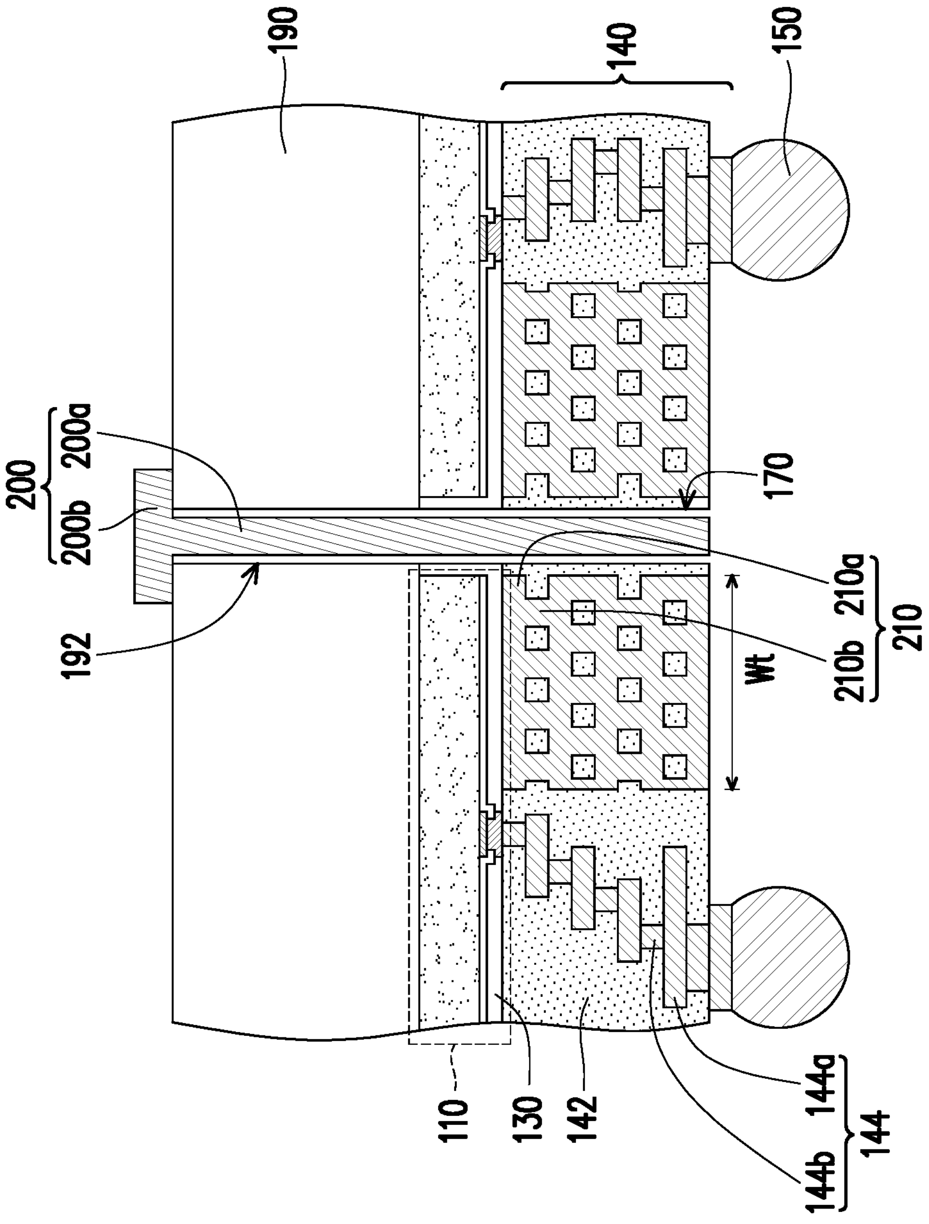

In some embodiments, the seal ring 210 may include a plurality of portions having different width and connected to one another, for example. However, the disclosure is not limited thereto. In some alternative embodiments, as shown in FIG. 6, a seal ring 210 may have a constant width W, and thus the seal ring 210 is similar to a plug, for example. In some alternative embodiments, as shown in FIGS. 7A to 7C, the seal ring 210 includes a plurality of conductive layers 210*a* and a plurality of conductive vias 210*b*. In some embodiments, at least two conductive vias 210*b* are disposed between two vertically adjacent conductive layers 210*a*, and thus the seal ring 210 may be formed as a net structure. In some embodiments, the conductive vias 210*b* between two vertically adjacent conductive layers 210*a* may be arranged in an array, for example. A line width W of the conductive vias 210*b* may be the same or different, and a space S between the conductive vias 210*b* may be the same or different, for example. A total width Wt of the net structure at one side of the screw 170 may range from 40 nm to 60 nm (such as the total width Wt in FIG. 7A), 80 nm to 120 nm (such as the total width Wt in FIG. 7B), 120 nm to 180 nm (not shown) or 160 nm to 240 nm (not shown), for example. It should be appreciated by those skilled in the art that the number and the size of the conductive layers 210*a* and the conductive vias 210*b* of the seal rings 210 is merely an example, and the number and the size of the conductive layers 210*a* and the conductive vias 210*b* of the seal rings 210 is not limited by the embodiments of the disclosure.

Figure 8A:
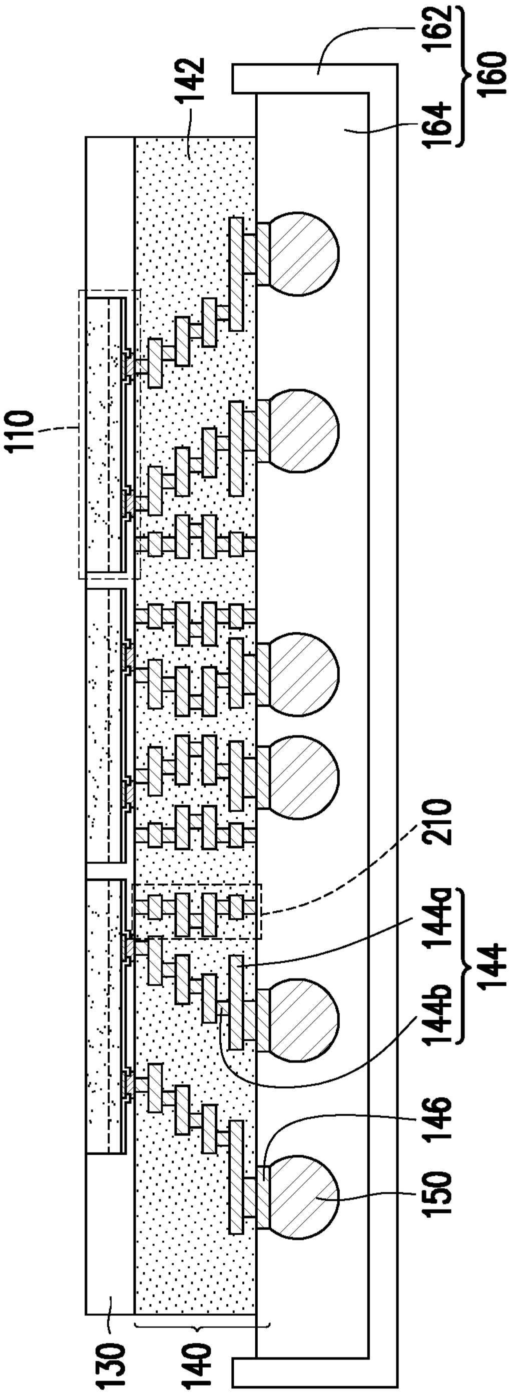
FIGS. 8A-8C are schematic cross-sectional views illustrating a method of forming a package structure in accordance with some embodiments of the disclosure.
Figure 8B:
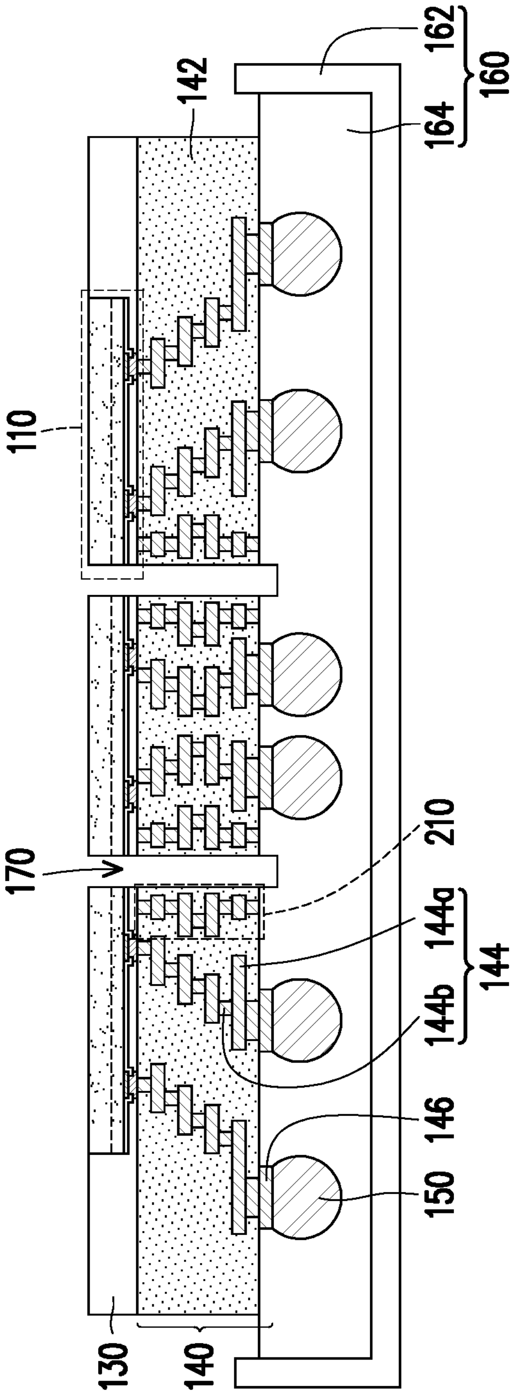
Figure 8C:
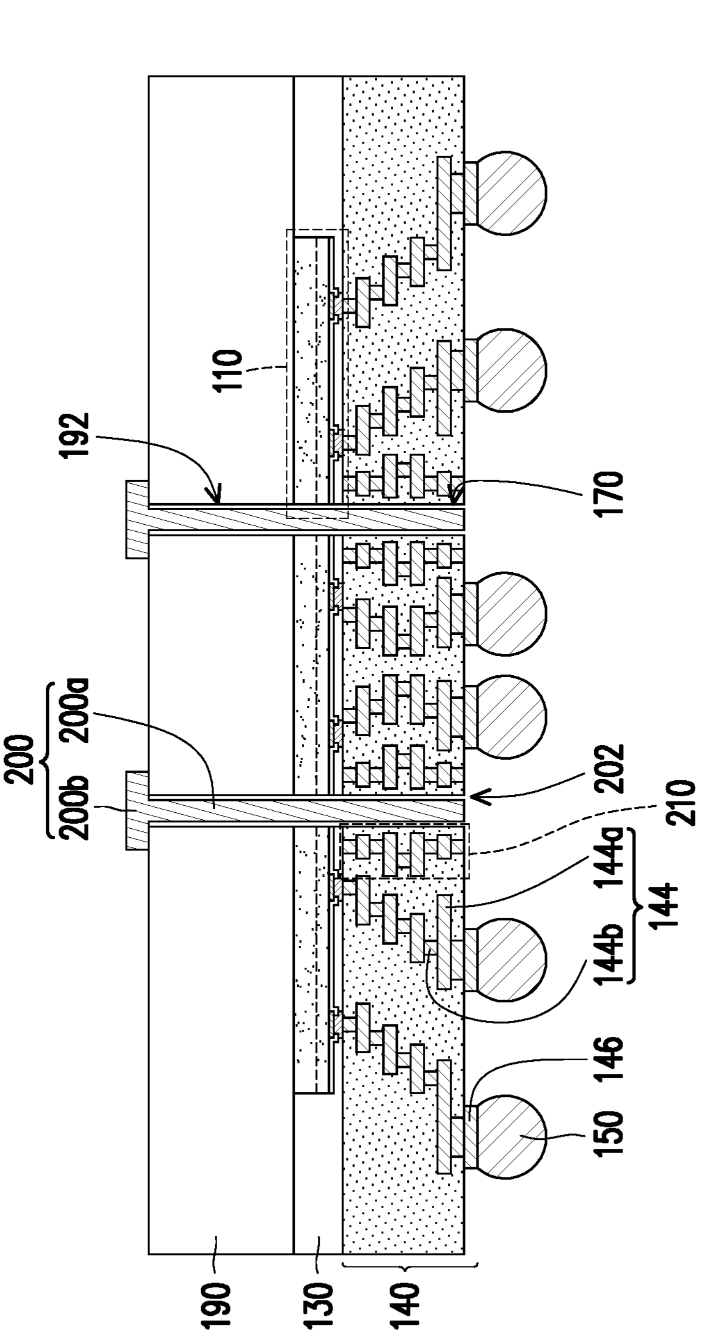
Figure 9A:
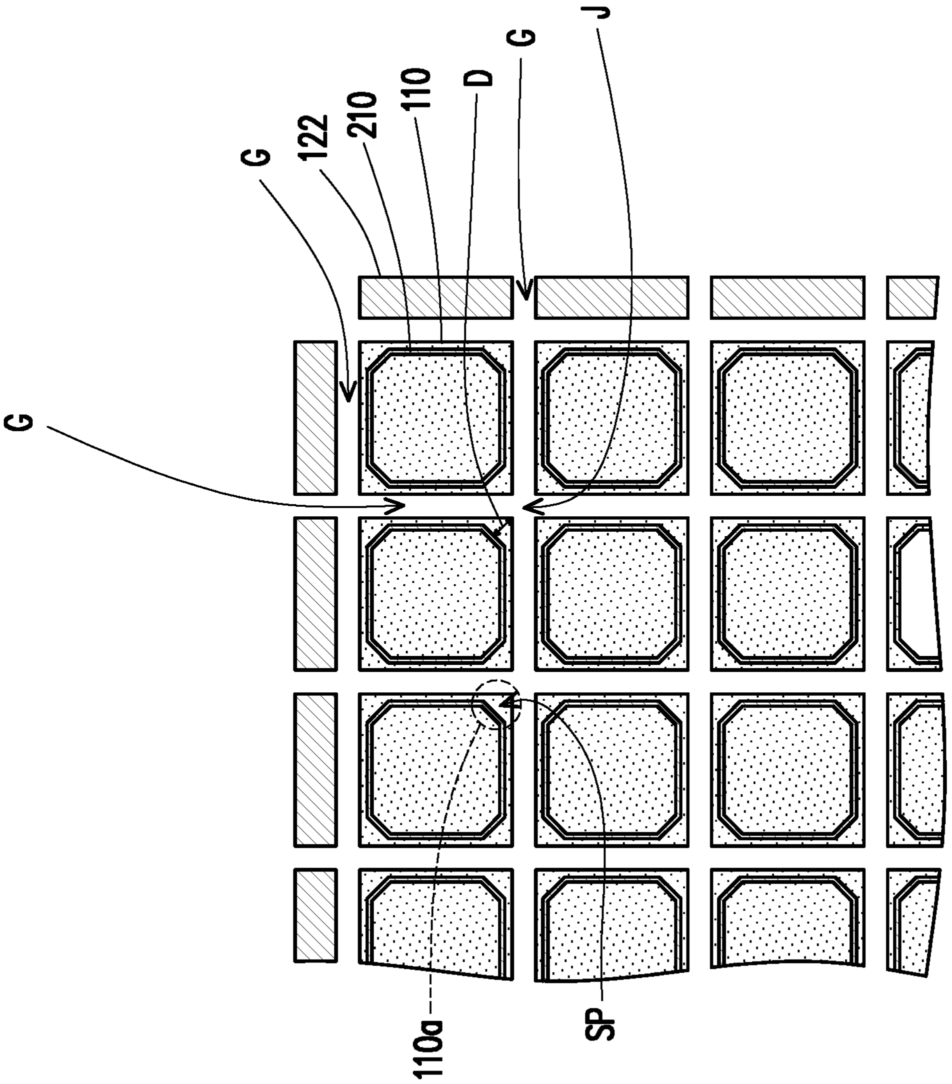
FIGS. 9A-9C are top views of FIGS. 8A-8C respectively.
Figure 9B:
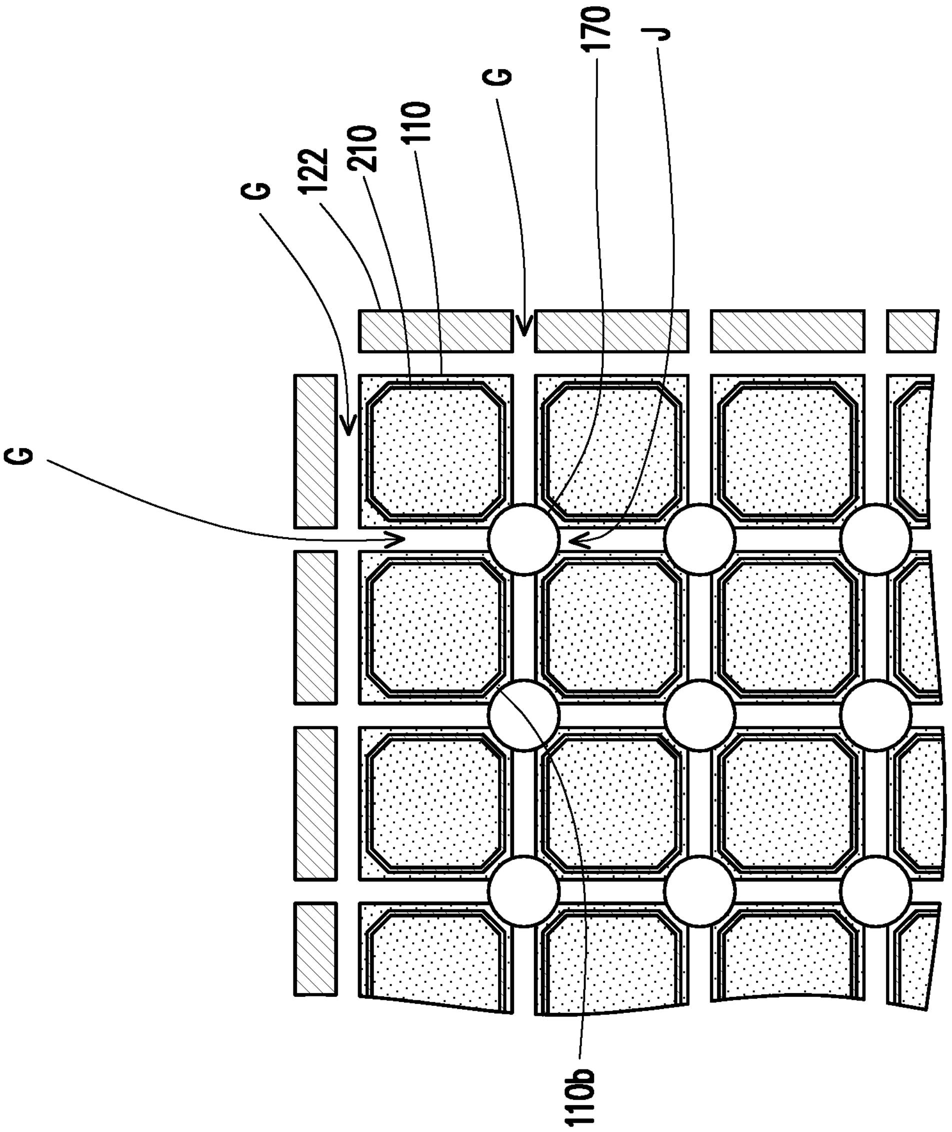
Figure 9C:
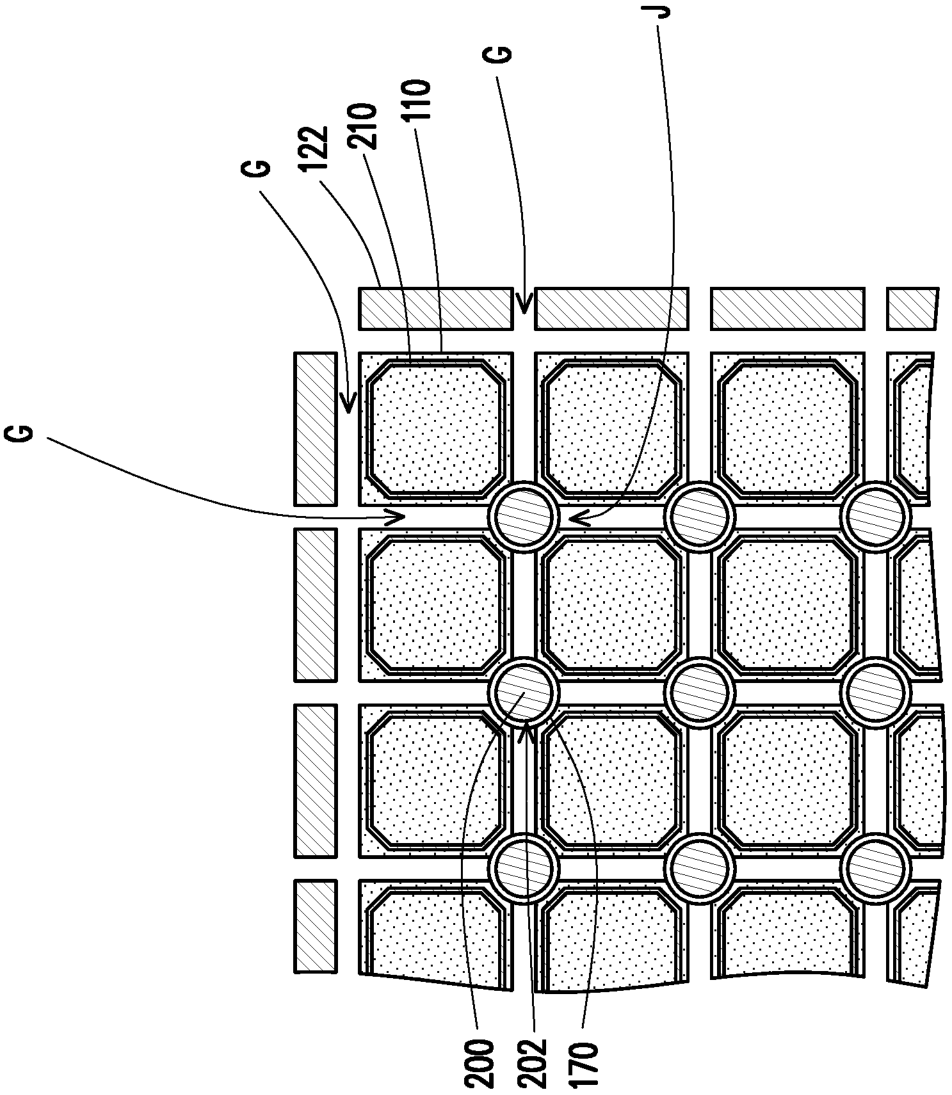

FIGS. 8A-8C are schematic cross-sectional views illustrating a method of forming a package structure in accordance with some embodiments of the disclosure, and FIGS. 9A-9C are top views of FIGS. 8A-8C respectively. For clarity, in FIG. 9A-9C, only dies, connectors, seal rings, holes, and screws are shown, and other elements are omitted. The method of FIGS. 8A-8C is similar to method of FIGS. 1C, 1D and 1F, and the main difference lies in that in the method of FIGS. 8A-8C, seal rings are formed over dies, and portions of the dies are removed to form holes for screws. The elements similar to or substantially the same as the elements described previously will use the same reference numbers, and certain details or descriptions of the same elements may not be repeated herein. Referring to FIGS. 8A and 9A, in some embodiments, a structure is provided onto a frame 160. In some embodiments, the structure includes a plurality of dies 110, seal rings 210, an encapsulant 130, a redistribution structure 140 and conductive elements 150. The dies 110 are encapsulated by the encapsulant 130. The redistribution structure 140 is disposed over the dies 110 and the encapsulant 130 and includes a dielectric layer 142 and a plurality of redistribution conductive patterns 144 in the dielectric layer 142. The conductive elements 150 are disposed over the redistribution structure 140. In some embodiments, the frame 160 includes a frame body 162 and a tape 164 thereon, the conductive elements 150 may be inserted into the tape 164. In some embodiments, seal rings 210 are formed in the dielectric layer 142 and respectively disposed over the dies 110. In some embodiments, a space SP between the seal ring 210 and the corner 110*a* of the die 110 is reserved. In some embodiments, the seal ring 210 may have a shape such as octagon or other suitable shape, for example. In some embodiments, a distance D is formed between an outer wall of the seal ring 210 and an edge of the die 110, and the distance D is equal to or larger than 10 μm, and ranges from 10 to 80 μm, for example.

Referring to FIGS. 8B and 9B, then, a hole 170 is formed by removing portions of the dielectric layer 142, the encapsulant 130 and the corners 110*a* of the dies 110. In some embodiments, after partially removed, a profile of an edge of the die 110, which is formed by removing the corner 110*a*, is coincide with a profile of an edge of the dielectric layer 142 therebeneath. In some embodiments, the seal ring 210 is separated from the hole 170, and a portion of the dielectric layer 142 is disposed between the seal ring 210 and the hole 170. In other words, the seal ring 210 is not in contact with a sidewall of the hole 170. After partially removed, the die 110 have an arc corner 110*b* being in contact with the hole 170.

Referring to FIGS. 8C and 9C, after that, the package is debonded from the frame 160, and a device 190 having a hole 192 is provided and then assembled to the package by inserting a screw 200 into the holes 170, 192. In some embodiments, a gap 202 is formed between the screw 200 and sidewalls of the holes 170, 192, in other word, the screw 200 may be not filled in the holes 170, 192. In some alternative embodiments, if the gap 202 is not formed between the hole 170 and the screw 200, the screw 200 may be in direct contact with the edge of the dies 110, for example. In some embodiments, the seal ring 210 is formed aside the screw 200. However, the disclosure is not limited thereto. In some alternative embodiments, the seal ring 210 may be omitted.

In some embodiments, the seal ring 210 is overlapped with the dies 110 aside the screw 200 in a direction of a thickness of the dies 110, however, the disclosure is not limited thereto. In some alternative embodiments, the seal ring 210 may be partially overlapped with the dies 110 or not overlapped with the dies 110. That is, a portion of the seal ring 210 may be disposed or extended outside the inner edges of the dies 110.

In some embodiments, by inserting the screw into the holes penetrating the device and the package, the device is flexibly assembled to the package to form a system level package. Thus, the device and the package may be combined securely. In addition, before forming the hole for the screw, the seal ring may be formed between the redistribution structure and a site in which the hole is to be formed. Therefore, during the formation of the hole, the seal ring serves as a wall to provides protection to the redistribution structure, to prevent the redistribution structure being cracked, delaminated or damaged. Accordingly, the seal ring may improve the yield and the reliability of the package structure.

In accordance with some embodiments of the present disclosure, a package structure includes a package, a device and a screw. The package includes a plurality of dies, an encapsulant encapsulating the plurality of dies, and a redistribution structure over the plurality of dies and the encapsulant. The device is disposed over the package, wherein the dies and the encapsulant are disposed between the device and the redistribution structure. The screw penetrates through the package and the device.

In accordance with alternative embodiments of the present disclosure, a package structure includes a plurality of dies, a redistribution structure, a device, a screw and a seal ring. The dies are encapsulated by an encapsulant. The redistribution structure is disposed over first sides of the plurality of dies and includes a dielectric layer and a plurality of redistribution conductive patterns in the dielectric layer. The device is disposed over second sides of the plurality of dies opposite to the first sides. The screw penetrates the device, the dielectric layer and the encapsulant. The seal ring are disposed in the dielectric layer, surrounds the screw in the dielectric layer and is electrically insulated from the redistribution conductive patterns.

In accordance with yet alternative embodiments of the present disclosure, a method of manufacturing a package structure includes the following steps. A package including a plurality of dies, an encapsulant encapsulating the plurality of dies and a redistribution structure over the plurality of die and the encapsulant is provided. A first hole is formed in the package. A device having a second hole is disposed onto the package. A screw is inserted into the first hole and the second hole.

In accordance with yet alternative embodiments of the present disclosure, a package structure includes a first die, an encapsulant and a securing element. The encapsulant encapsulates the first die. The securing element penetrates through the encapsulant and a corner of the first die and electrically isolated from the first die.

In accordance with yet alternative embodiments of the present disclosure, a package structure includes a first die, a redistribution structure, a screw and a seal ring. The first die is encapsulated by an encapsulant. The redistribution structure is disposed over a first side of the first die, and the redistribution structure includes a dielectric layer and a plurality of redistribution conductive patterns in the dielectric layer. The screw penetrates the dielectric layer and the encapsulant. The seal ring is disposed in the dielectric layer and electrically insulated from the redistribution conductive patterns. The seal ring includes a plurality of first conductive layers and a plurality of first conductive vias between the plurality of first conductive layers.

In accordance with yet alternative embodiments of the present disclosure, a method of manufacturing a package structure includes the following steps. A package including at least one die and an encapsulant encapsulating the at least one die is provided. A first hole is formed in the package, and the first hole penetrates a corner of the at least one die. A securing element is inserted into the first hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
- a first die;
- an encapsulant encapsulating the first die;
- a redistribution structure disposed over and electrically connected to the first die, comprising a dielectric layer;
- a securing element, penetrating through the dielectric layer of the redistribution structure, the encapsulant and an outer peripheral edge corner of the first die and completely electrically isolated from the first die; and
- a plurality of solder regions, wherein the redistribution structure is electrically connected to and disposed between the plurality of solder regions and the first die.

2. The package structure of claim 1 further comprising an electrical device over the first die, wherein the securing element further penetrates the electrical device.

3. The package structure of claim 1 further comprising a seal ring over the first die, and the seal ring is disposed between the securing element and the redistribution structure.

4. The package structure of claim 1, wherein a surface of the securing element is substantially flush with a surface of the dielectric layer of the redistribution structure.

5. The package structure of claim 1, wherein a gap is formed between the securing element and the first die, and the gap surrounds the securing element.

6. The package structure of claim 1, wherein the securing element is electrically isolated from the redistribution structure.

7. The package structure of claim 1, wherein the securing element is in direct contact with the first die.

8. A package structure, comprising:
- a first die encapsulated by an encapsulant;
- a redistribution structure over a first side of the first die, the redistribution structure comprising a dielectric layer and a plurality of redistribution conductive patterns in the dielectric layer;
- a screw, penetrating the dielectric layer of the redistribution structure, the encapsulant and an outer peripheral edge corner of the first die; and
- a seal ring in the dielectric layer, electrically insulated from the redistribution conductive patterns, wherein the seal ring comprises a plurality of first conductive layers and a plurality of first conductive vias between the plurality of first conductive layers.

9. The package structure of claim 8, wherein the redistribution conductive patterns comprise a plurality of second conductive layers and a plurality of second conductive vias between the plurality of second conductive layers, bottom surfaces of the plurality of first conductive layers are substantially coplanar with bottom surfaces of the plurality of second conductive layers.

10. The package structure of claim 8, wherein the seal ring is disposed between the plurality of redistribution conductive patterns and the screw.

11. The package structure of claim 8 further comprising an electrical device, wherein the first die is disposed between the electrical device and the redistribution structure, and the screw further penetrates the electrical device.

12. The package structure of claim 8 further comprising a second die aside the first die and encapsulated by the encapsulant, wherein the screw is disposed between the first die and the second die.

13. The package structure of claim 8, wherein surfaces of the dielectric layer, the seal ring and the screw are substantially coplanar.

14. A method of manufacturing a package structure, comprising:
- providing a package comprising a first die, an encapsulant encapsulating the first die and a redistribution structure disposed over and electrically connected to the package and comprising a dielectric layer, the package further comprises a seal ring;
- forming a first hole in the package, the first hole penetrating an outer peripheral edge corner of the first die and the dielectric layer of the redistribution structure; and
- inserting a securing element into the first hole, wherein the securing element is completely electrically isolated from the first die, and the seal ring is disposed between the securing element and the redistribution structure.

15. The method of claim 14, wherein the package further comprises a second die adjacent to the first die, and the first hole further penetrates an outer peripheral edge corner of the second die.

16. The method of claim 14 further comprising providing an electrical device comprising a second hole, wherein the securing element further inserts into the second hole.

17. The method of claim 14, wherein the first hole is formed by removing the outer peripheral edge corner of the first die and a portion of the encapsulant.

18. The method of claim 15, wherein the first hole is formed by removing the outer peripheral edge corners of the first die and the second die and a portion of the encapsulant.

19. The method of claim 14, wherein the seal ring is disposed along a periphery of the first die.

20. The method of claim 14, wherein the redistribution structure comprises a dielectric layer, and the seal ring is disposed in the dielectric layer.

* * * * *